US011871626B2

(12) United States Patent
Dai et al.

(10) Patent No.: US 11,871,626 B2
(45) Date of Patent: Jan. 9, 2024

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jie Dai, Beijing (CN); Yi Qu, Beijing (CN); Pengfei Yu, Beijing (CN); Sen Du, Beijing (CN); Li Song, Beijing (CN); Lu Bai, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 209 days.

(21) Appl. No.: 17/283,580

(22) PCT Filed: Jun. 30, 2020

(86) PCT No.: PCT/CN2020/099126
§ 371 (c)(1),
(2) Date: Apr. 8, 2021

(87) PCT Pub. No.: WO2022/000232
PCT Pub. Date: Jan. 6, 2022

(65) Prior Publication Data
US 2022/0190090 A1   Jun. 16, 2022

(51) Int. Cl.
*H01L 27/32* (2006.01)
*H10K 59/131* (2023.01)
(Continued)

(52) U.S. Cl.
CPC ......... *H10K 59/131* (2023.02); *H10K 59/122* (2023.02); *H10K 59/1213* (2023.02); *H10K 59/1216* (2023.02); *H10K 59/124* (2023.02)

(58) Field of Classification Search
CPC . H01L 27/32; H01L 27/3276; H01L 27/3246; H01L 27/3262; H01L 27/3265;
(Continued)

(56) References Cited

U.S. PATENT DOCUMENTS

2006/0060850 A1   3/2006   Kwak et al.
2011/0043495 A1   2/2011   Bang et al.
(Continued)

FOREIGN PATENT DOCUMENTS

CN   106997930 A   8/2017
CN   108281571 A   7/2018
(Continued)

*Primary Examiner* — Cuong B Nguyen
*Assistant Examiner* — Leo B Seballos
(74) *Attorney, Agent, or Firm* — The Webb Law Firm

(57) ABSTRACT

Provided are a display panel and a display device. The display panel includes: a base substrate including a display area and a peripheral area; a plurality of sub-pixels; a driving circuit; a power line; a connection layer electrically connected to the power line and located on one side of the driving circuit and the power line away from the base substrate, an orthographic projection of the connection layer on the base substrate partially overlaps with that of the driving circuit on the base substrate, and a minimum distance between an edge of the orthographic projection of the connection layer on the base substrate close to the display area and an edge of an orthographic projection of an anode, which is closest to an edge of the display area of a plurality of anodes of the sub-pixels, on the base substrate ranges from 150 to 250 microns; and a cathode.

20 Claims, 8 Drawing Sheets

(51) Int. Cl.
*H10K 59/122* (2023.01)
*H10K 59/121* (2023.01)
*H10K 59/124* (2023.01)

(58) Field of Classification Search
CPC ............ H01L 27/3258; H01L 27/3248; H01L 51/5206; G09G 2300/0439; G09G 2300/08; G09G 2300/0876; G09G 3/3233; G09G 3/3241; G09G 2300/0408; G09G 3/3266; G09G 2310/0286; H05B 33/06
See application file for complete search history.

(56) References Cited

U.S. PATENT DOCUMENTS

| | | | |
|---|---|---|---|
| 2019/0006442 A1* | 1/2019 | Byun et al. | |
| 2019/0393293 A1 | 12/2019 | Lee | |
| 2019/0393443 A1 | 12/2019 | Chen | |
| 2020/0111857 A1 | 4/2020 | Moon et al. | |
| 2020/0136081 A1 | 4/2020 | Zhao et al. | |
| 2020/0258963 A1* | 4/2020 | Lhee et al. | |

FOREIGN PATENT DOCUMENTS

| | | |
|---|---|---|
| CN | 109545831 A | 3/2019 |
| CN | 109802048 A | 5/2019 |
| CN | 110690365 A | 1/2020 |
| CN | 110767731 A | 2/2020 |
| CN | 111009548 A | 4/2020 |
| CN | 210377421 U | 4/2020 |
| EP | 2019432 A2 | 1/2009 |
| EP | 2835831 A2 | 2/2015 |

\* cited by examiner

DISPLAY PANEL AND DISPLAY DEVICE

CROSS-REFERENCE TO RELATED APPLICATION

The present application is a U.S. National Stage Application under 35 U.S.C. § 371 of International Patent Application No. PCT/CN2020/099126, filed on Jun. 30, 2020, the disclosure of which is incorporated by reference herein in its entirety.

TECHNICAL FIELD

The present disclosure relates to a display panel and a display device.

BACKGROUND

With the development of display technology, the display panel with an OLED (Organic Light-Emitting Diode) as alight-emitting device has been rapidly developed.

If water vapor enters a light-emitting function layer in the OLED, it is likely to cause that the light-emitting function layer is malfunctioned and cannot emit light, thereby leading to poor display such as growing dark spot (GDS) of the display panel.

SUMMARY

According to one aspect of the embodiments of the present disclosure, provided is a display panel comprising: a base substrate comprising a display area and a peripheral area surrounding the display area; a plurality of sub-pixels located at the display area, wherein each of the plurality of sub-pixels comprises an anode located on one side of the base substrate and a light-emitting function layer located on one side of the anode away from the base substrate; a driving circuit located at the peripheral area, and configured to output a gate driving signal and a light-emitting control scanning signal to the plurality of sub-pixels; a power line located on one side of the driving circuit away from the display area; a connection layer electrically connected to the power line and located on one side of the driving circuit and the power line away from the base substrate, wherein an orthographic projection of the connection layer on the base substrate partially overlaps with an orthographic projection of the driving circuit on the base substrate, and a minimum distance between an edge of the orthographic projection of the connection layer on the base substrate close to the display area and an edge of an orthographic projection of the anode, which is closest to an edge of the display area of a plurality of anodes of the plurality of sub-pixels, on the base substrate ranges from 150 microns to 250 microns; and a cathode electrically connected to the connection layer, located at the display area and the peripheral area, and located on one side of the light-emitting function layer and the connection layer away from the base substrate.

In some embodiments, the driving circuit comprises: a gate driving circuit located between the display area and the power line, and configured to output the gate drive signal to the plurality of sub-pixels; and a light-emitting control driving circuit located between the power line and the gate driving circuit, and configured to output the light-emitting control scanning signal to the plurality of sub-pixels, wherein the edge of the orthographic projection of the connection layer on the base substrate close to the display area is at least partially located within an orthographic projection of the gate driving circuit on the base substrate.

In some embodiments, the gate driving circuit comprises a plurality of gate driving units, each of the plurality of gate driving units comprising: a first gate driving sub-circuit comprising an input terminal of the each of the plurality of gate driving units; and a second gate driving sub-circuit electrically connected to the first gate driving sub-circuit, located between the first gate driving sub-circuit and the display area, and comprising an output terminal of the each of the plurality of gate driving units, wherein an orthographic projection of the second gate driving sub-circuit on the base substrate overlaps with the edge of the orthographic projection of the connection layer on the base substrate close to the display area.

In some embodiments, the second gate driving sub-circuit comprises: a first capacitor comprising a first electrode plate and a second electrode plate which is electrically connected to a first power signal line configured to provide a first power voltage; a second capacitor comprising a first electrode plate and a second electrode plate which is electrically connected to the output terminal; and a first group of transistors, each of which comprising a first gate and a first active layer, wherein the first active layer comprises a first electrode area, a second electrode area, and a channel area located between the first electrode area and the second electrode area, the first group of transistors comprising: a fourth transistor, wherein the first gate of the fourth transistor is electrically connected to the second electrode plate of the first capacitor, and the first electrode area of the fourth transistor is electrically connected to the first power signal line, and a fifth transistor, wherein the first gate of the fifth transistor is electrically connected to the first electrode plate of the second capacitor, and the first electrode area of the fifth transistor is electrically connected to a first clock signal line configured to provide a first clock signal, wherein one of the second electrode area of the fifth transistor and the second electrode area of the fourth transistor serves as the output terminal, wherein orthographic projections of the fourth transistor and the fifth transistor on the base substrate overlap with the edge of the orthographic projection of the connection layer on the base substrate close to the display area, and orthographic projections of the first capacitor and the second capacitor on the base substrate do not overlap with the edge of the orthographic projection of the connection layer on the base substrate close to the display area.

In some embodiments, a distance between an edge of an orthographic projection of the first active layer of each of the fourth transistor and the fifth transistor on the base substrate away from the display area and the edge of the orthographic projection of the connection layer on the base substrate close to the display area ranges from 15 micrometers to 25 micrometers.

In some embodiments, a distance between the edge of the orthographic projection of the connection layer on the base substrate close to the display area and an edge of the orthographic projection of the gate driving circuit on the base substrate away from the display area is a first distance; and a distance between the edge of the orthographic projection of the connection layer on the base substrate close to the display area and an edge of the orthographic projection of the gate driving circuit on the base substrate close to the display area is a second distance approximately equal to the first distance.

In some embodiments, the display panel further comprises: a first planarization layer located at the display area and the peripheral area, and comprising a first planarization portion located between the driving circuit and the connection layer, wherein the connection layer comprises a plurality of first openings spaced apart from each other, wherein orthographic projections of the plurality of first openings on the base substrate at least partially overlap with an orthographic projection of the first planarization portion on the base substrate.

In some embodiments, the connection layer comprises a plurality of regions adjacent to each other, wherein: each of the plurality of regions comprises one of the plurality of first openings and a non-opening area other than the one of the plurality of first openings, and a ratio of an area of an orthographic projection of the one of the plurality of first openings in the each of the plurality of regions on the base substrate to an area of an orthographic projection of the each of the plurality of regions on the base substrate ranges from 18% to 31%.

In some embodiments, orthographic projections of the plurality of regions on the base substrate have a same area, and orthographic projections of the plurality of first openings on the base substrate have a same area.

In some embodiments, the first planarization layer comprises a second opening located at the peripheral area and extending along a periphery of the display area; and the display panel further comprises: a first conductive portion located in the second opening, located between the power line and the connection layer, and in contact with the power line and the connection layer, and a pixel defining layer located on one side of the connection layer away from the base substrate, and comprising a first pixel defining portion located at the peripheral area, wherein the first pixel defining portion comprises a plurality of filling portions spaced apart from each other, and located in the plurality of first openings in a one-to-one correspondence, and the cathode is in contact with a portion of the connection layer not covered by the pixel defining layer.

In some embodiments, the gate driving circuit comprises a first clock signal line and a second clock signal line located on one side of the first clock signal line away from the display area; the first planarization portion comprises a third opening located above the first clock signal line and a fourth opening located above the second clock signal line; and the display panel further comprises: a second conductive portion located in the third opening and in contact with the first clock signal line, a third conductive portion located in the fourth opening and in contact with the second clock signal line, a second planarization layer located on one side of the first planarization layer away from the base substrate, and comprising: a second planarization portion located between the first planarization portion and the connection layer, and covering the second conductive portion and the third conductive portion, and a third planarization portion spaced apart from the second planarization portion, located on one side of the light-emitting control driving circuit away from the display area, and comprising a fifth opening located above the first conductive portion, wherein the connection layer is partially located in the fifth opening, and a portion of the connection layer located between the third planarization portion and the second planarization portion is at least partially in contact with the first planarization layer.

In some embodiments, a maximum thickness of a portion of the second planarization portion in contact with the first planarization layer is smaller than a maximum thickness of a portion of the third planarization portion in contact with first planarization layer.

In some embodiments, a thickness of the second planarization portion is greater than or equal to 1 micrometer and smaller than 1.5 micrometers; and a thickness of the third planarization portion is greater than or equal to 1.5 micrometers and smaller than or equal to 2 micrometers.

In some embodiments, at least one of the plurality of sub-pixels further comprises a pixel driving circuit comprising: a second active layer located on one side of the base substrate close to the anode, a second gate located on one side of the second active layer away from the base substrate, an interlayer insulating layer located on one side of the second gate away from the base substrate and covering the second gate, and a first electrode and a second electrode which are located on one side of the interlayer insulating layer away from the base substrate and electrically connected to the second active layer; the first planarization layer is located on one side of the interlayer insulating layer away from the base substrate, and further comprises a sixth opening located at the display area; the second planarization layer further comprises a fourth planarization portion spaced apart from the second planarization portion, located on one side of the second planarization portion away from the third planarization portion, and comprising a seventh opening located at the display area, wherein the anode is partially located in the seventh opening, and a maximum thickness of a portion of the second planarization portion in contact with the first planarization layer is smaller than a maximum thickness of a portion of the fourth planarization portion in contact with the first planarization layer; and the display panel further comprises a fourth conductive portion located in the sixth opening and in contact with the first electrode.

In some embodiments, at least one of the first conductive portion, the second conductive portion, or the third conductive portion is located in a same layer as the fourth conductive portion; at least one of the power line, the first clock signal line, or the second clock signal line is located in a same layer as the first electrode; and the connection layer is located in a same layer as the anode.

In some embodiments, the first planarization layer further comprises an eighth opening located at the peripheral area and located between the gate driving circuit and the display area; and the display panel further comprises: an initialization line located between the interlayer insulating layer and the first planarization layer, and located between the gate driving circuit and the display area, and a fifth conductive portion located in the eighth opening and in contact with the initialization line.

In some embodiments, the pixel defining layer further comprises: a second pixel defining portion located on one side of the first pixel defining portion away from the power line, and comprising a ninth opening located at the display area and located above the anode, wherein the light-emitting function layer is located in the ninth opening and in contact with the anode, wherein: the edge of the orthographic projection of the connection layer on the base substrate close to the display area is located between an edge of an orthographic projection of the second pixel defining portion on the base substrate away from the display area and the display area, and the edge of the orthographic projection of the second pixel defining portion on the base substrate away from the display area has a plurality of first recesses, wherein orthographic projections of the plurality of first recesses on the base substrate do not overlap with the orthographic projections of the plurality of first openings on the base substrate.

In some embodiments, the first planarization layer comprises a tenth opening extending along a periphery of the display area and located between the light-emitting control driving circuit and the gate driving circuit.

In some embodiments, the first gate driving sub-circuit comprises a second group of transistors, each of which comprising the first gate and the first active layer, the second group of transistors comprising: a first transistor, wherein the first gate of the first transistor is electrically connected to a second clock signal line configured to provide a second clock signal, and the first electrode area of the first transistor serves as the input terminal; a second transistor, wherein the first gate of the second transistor is electrically connected to the second electrode area of the first transistor, and the first electrode area of the second transistor is electrically connected to the first gate of the first transistor; a third transistor, wherein the first gate of the third transistor is electrically connected to the first gate of the first transistor, the first electrode area of the third transistor is electrically connected to a second power signal line configured to receive a second power voltage, and the second electrode area of the third transistor is electrically connected to the second electrode area of the second transistor; a sixth transistor, wherein the first gate of the sixth transistor is electrically connected to the second electrode area of the second transistor, the second electrode area of the third transistor and the first gate of the fourth transistor, and the first electrode area of the sixth transistor is electrically connected to the first electrode area of the fourth transistor; a seventh transistor, wherein the first gate of the seventh transistor is electrically connected to the first electrode area of the fifth transistor, the first electrode area of the seventh transistor is electrically connected to the second electrode area of the sixth transistor, and the second electrode area of the seventh transistor is electrically connected to the first gate of the second transistor; and an eighth transistor, wherein the first gate of the eighth transistor is electrically connected to the second power signal line, the first electrode area of the eighth transistor is electrically connected to the first gate of the second transistor, and the second electrode area of the eighth transistor is electrically connected to the first gate of the fifth transistor.

In some embodiments, the edge of the orthographic projection of the connection layer on the base substrate close to the display area has a plurality of second recesses.

According to another aspect of the embodiments of the present disclosure, provided is a display device comprising the display panel according to any one of the above embodiments.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1A:
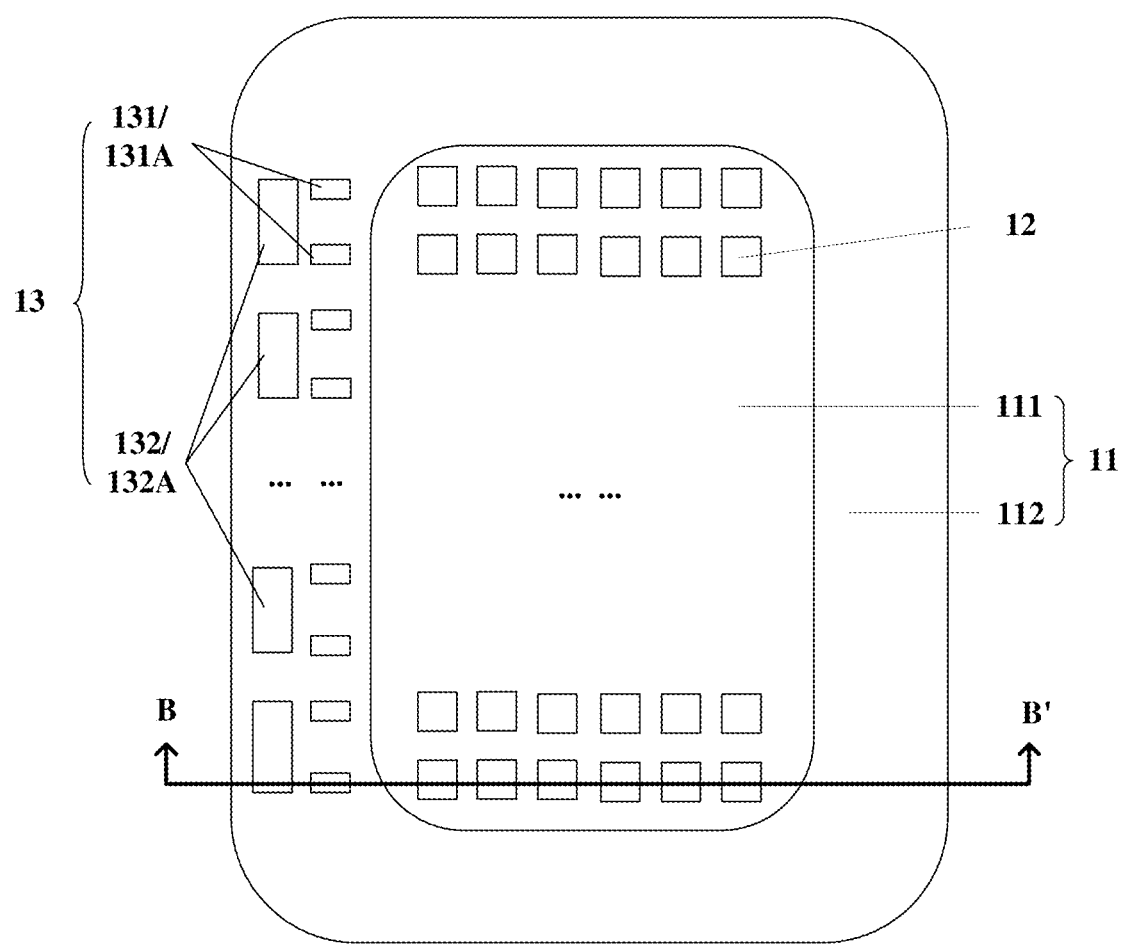
FIG. 1A is a schematic top view showing a display panel according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noticed that a signal connection layer located above a driving circuit at the peripheral area is likely to conduct water vapor. If the edge of the signal connection layer is too close to the edge of the display area, it is likely to conduct water vapor to the display area, thereby affecting the normal light emission of sub-pixels located at the display area, and further affecting the display effect of the display panel.

In view of the above, the embodiments of the present disclosure provide the following technical solutions.

Figure 1B:
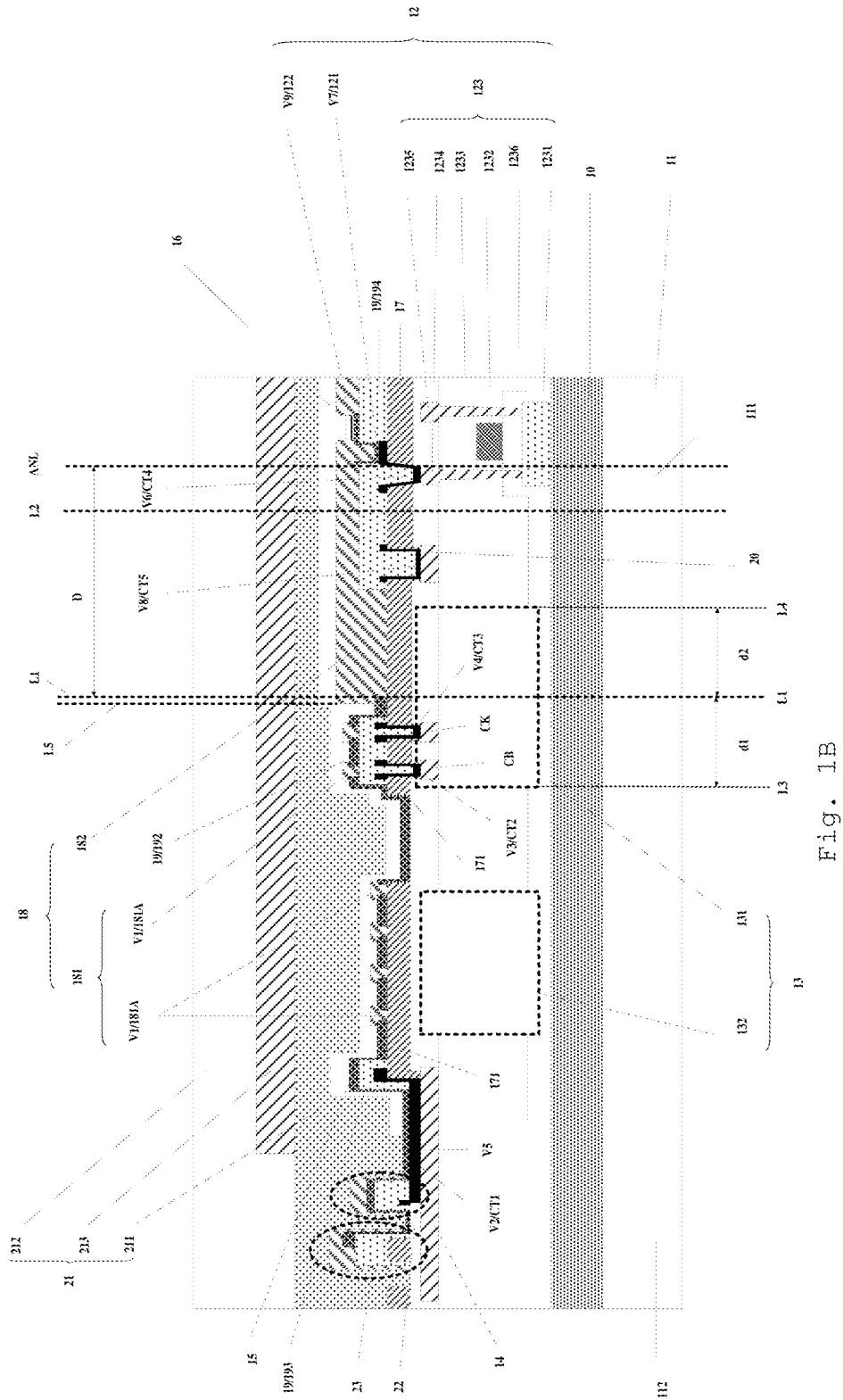
FIG. 1B is a schematic cross-sectional view taken along B-B' shown in FIG. 1A.
Figure 1C:
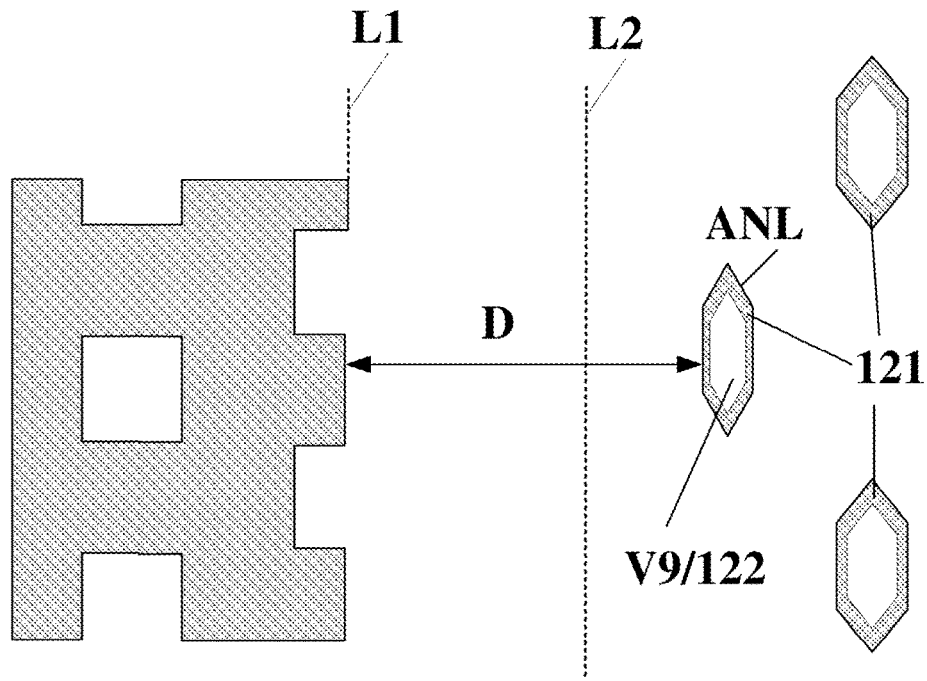
FIG. 1C is a schematic view showing a relative positional relationship between a connection layer and an anode according to an embodiment of the present disclosure.

FIG. 1A is a schematic top view showing a display panel according to an embodiment of the present disclosure. FIG. 1B is a schematic cross-sectional view taken along B-B' shown in FIG. 1A. FIG. 1C is a schematic view showing a relative positional relationship between a connection layer and an anode according to an embodiment of the present disclosure.

The display panel according to some embodiments of the present disclosure will be introduced in conjunction with FIGS. 1A and 1B below.

As shown in FIGS. 1A and 1B, the display panel comprises a base substrate 11, a plurality of sub-pixels 12, a driving circuit 13, a power line 14, a connection layer 15 and a cathode 16.

Referring to FIG. 1A, the base substrate 11 comprises a display area 111 and a peripheral area 112 surrounding the display area 111. In some embodiments, the base substrate 11 may comprise a flexible substrate, such as a polyimide (PI) substrate or the like.

The plurality of sub-pixels 12 is located at the display area 111. In some embodiments, the plurality of sub-pixels 12 may comprise red sub-pixels, green sub-pixels, or blue sub-pixels, and the like. Each sub-pixel 12 of the plurality of sub-pixels 12 comprises an anode 121 located on one side of the base substrate 11 and a light-emitting function layer 122 located on one side of the anode 121 away from the base substrate 11. It can be understood that since each sub-pixel 12 comprises an anode 121, the plurality of sub-pixels 12 comprises a plurality of anodes 121. The anode 121 may comprise, for example, indium tin oxide (ITO), or a stack comprising ITO/Ag/ITO. The light-emitting functional layer 122 at least comprises a light-emitting material layer, such as an organic light-emitting material layer. In some embodiments, the light-emitting functional layer 122 may further comprise one or more of an electron transport layer, an electron injection layer, a hole transport layer, and a hole injection layer.

In some embodiments, at least one sub-pixel 12 further comprises a pixel driving circuit 123. For example, the pixel driving circuit 123 may comprise 6 thin film transistors and 1 capacitor (6T1C); for another example, the pixel driving circuit 123 may comprise 7 thin film transistors and 1 capacitor (7T1C). The pixel driving circuit 123 will be introduced hereinafter in conjunction with other embodiments.

Referring to FIGS. 1A and 1B, the driving circuit 13 is located at the peripheral area 112. The driving circuit 13 is configured to output a gate driving signal and a light-emitting control scanning signal to the plurality of sub-pixels 12. For example, the driving circuit 13 comprises a gate driving circuit 131 and a light-emitting control driving circuit 132. The gate driving circuit 131 is configured to output gate driving signals to the plurality of sub-pixels 12, and the light-emitting control driving circuit 132 is configured to output light-emitting control scanning signals to the plurality of sub-pixels 12.

In some embodiments, referring to FIG. 1A, the gate driving circuit 131 comprises a plurality of gate driving units 131A. For example, each gate driving unit 131A is configured to provide a gate driving signal to a corresponding row of sub-pixels 12. In other words, one gate driving unit 131A corresponds to one row of sub-pixels 12. In some embodiments, the light-emitting control driving circuit 132 comprises a plurality of light-emitting control driving units 132A. For example, each light-emitting control driving unit 132A is configured to provide a light-emitting control driving signal to at least one corresponding row of sub-pixels 12. For example, one light-emitting control driving unit 132A corresponds to two rows of sub-pixels 12. For example, the plurality of gate driving units 131A is a plurality of first shift registers connected in cascade, and the plurality of light-emitting control drive units 132A is a plurality of second shift registers connected in cascade.

Referring to FIG. 1B, the power line 14 is located on one side of the driving circuit 13 away from the display area 111, and the connection layer 15 is electrically connected to the power line 14 and the cathode 16. In other words, the power line 14 and the cathode 16 are electrically connected to each other via the connection layer 15. For example, the connection layer 15 may be electrically connected to the power line 14 via other intermediate layers. For example, the connection layer 15 may be in contact with the cathode 16. The implementation of the connection layer 15 electrically connected to the power line 14 and the cathode 16 will be described hereinafter in conjunction with other embodiments.

The connection layer 15 is located on one side of the driving circuit 13 and the power line 14 away from the base substrate 11. The orthographic projection of the connection layer 15 on the base substrate 11 partially overlaps with the orthographic projection of the driving circuit 13 on the base substrate 11.

Referring to FIGS. 1B and 1C, for the purpose of description, the edge of the orthographic projection of the connection layer 15 on the base substrate 11 that is close to the display area 111 is defined as the edge L1, the edge of the display area 111 is defined as the edge L2, and the edge of the orthographic projection of the anode 121, which is closest to the edge L2 of the display area 111 of the plurality of anodes 121 of the plurality of sub-pixels 12, on the base substrate 11 is defined as the edge ANL. It should be understood that the edge ANL depends on the shape of the orthographic projection of the anode 121 on the base substrate 11. Here, the edge ANL in FIG. 1C is schematically showed to comprise six sides.

The minimum distance D between the edge L1 and the edge ANL ranges from 150 microns to 250 microns. It should be understood that, the minimum distance D between the edge L1 and the edge ANL may be understood as a minimum value of distances between various points on the edge L1 and various points on the edge ANL. For example, D is 150 microns, 170 microns, 200 microns, 220 microns, 230 microns, 250 microns, or the like.

The cathode 16 is located at the display area 111 and peripheral area 112 and located on one side of the light-emitting function layer 122 and the connection layer 15 away from the base substrate 11. For example, the cathode 16 extends from the display area 111 to the peripheral area 112. In some implementations, the cathode 16 is shared by the plurality of sub-pixels 12 located at the display area 111. For example, the cathode 16 is a surface electrode. The material of the cathode 16 may comprise materials such as ytterbium magnesium alloy.

In the above embodiments, the minimum distance D between the edge L1 of the orthographic projection of the connection layer 15 on the base substrate 11 that is close to the display area 111 and the edge ANL of the orthographic projection of the anode 121, which is closest to the edge L2 of the display area 111 of the plurality of anodes 121 of the plurality of sub-pixels 12, on the base substrate 11 ranges from 150 microns to 250 microns. Within such a range, the distance between the connection layer 15 and the display area 111 is relatively reduced, which reduces the adverse effect of water vapor in the connection layer 15 on the sub-pixels 12 of the display area 111 and improves the display effect of the display panel.

In some embodiments, the reduction of the distance between the connection layer 15 and the display area 111 is also favorable for reducing the capacitance of the capacitor formed between the connection layer 15 and the metal layer(s) in the driving circuit 13, thereby facilitating the stable output of the gate driving signal and the light-emitting control driving signal and further improving the display effect of the display panel.

In some embodiments, referring to FIG. 1B, the display panel may further comprise a barrier layer 10 located on one side of the base substrate 11. The plurality of sub-pixels 12, the driving circuit 13, the power line 14, the connection layer 15 and the cathode 16 are located on one side of the barrier layer 10 away from the base substrate 11. The barrier layer 10 may block certain elements (for example, hydrogen element, or the like) in the base substrate 11 from entering the driving circuit 13 or the sub-pixel 12, so as to reduce the adverse effects of these elements on the driving circuit 13 and the sub-pixels 12. For example, the material of the barrier layer 10 may comprise inorganic materials such as silicon oxide, silicon nitride, or silicon oxynitride.

In some embodiments, referring to FIG. 1B, the display panel may further comprise an encapsulation layer 21 located on one side of the cathode 16 away from the base substrate 11. For example, the encapsulation layer 21 may comprise a first inorganic layer 211, a second inorganic layer 212, and an organic layer 213 between the first inorganic layer 211 and the second inorganic layer 212.

Some implementations of the driving circuit 13 will be introduced below.

As described above, in some implementations, the driving circuit 13 comprises the above gate driving circuit 131 and the above light-emitting control driving circuit 132. The gate driving circuit 131 is located between the display area 111 and the power line 14, and the light-emitting control driving circuit 132 is located between the power line 14 and the gate driving circuit 131. In other words, the light-emitting control driving circuit 132 is located on one side of the gate driving circuit 131 away from the display area 111. The edge L1 of the orthographic projection of the connection layer 15 on the base substrate 11 that is close to the display area 111 is at least partially located within the orthographic projection of the gate driving circuit 131 on the base substrate 11. In this case, the distance between the connection layer 15 and the display area 111 may be reduced as much as possible, thereby reducing the adverse effects of water vapor in the connection layer 15 on the sub-pixels 12 of the display area 111 more effectively, and further improving the display effect of the display panel.

As some implementations, referring to FIG. 1B, the distance between the edge L1 of the orthographic projection of the connection layer 15 on the base substrate 11 that is close to the display area 111 and the edge L3 of the orthographic projection of the gate driving circuit 131 on the base substrate 11 that is away from the display area 111 is a first distance d1; and the distance between the edge L1 of the orthographic projection of the connection layer 15 on the base substrate 11 that is close to the display area 111 and the edge L4 of the orthographic projection of the gate driving circuit 131 on the base substrate 11 that is close to the display area 111 is a second distance d2. Here, the second distance d2 is approximately equal to the first distance d1, that is, the second distance d2 is equal to the first distance d1 within a process deviation range of the semiconductor process. In this case, the distance between the connection layer 15 and the display area 111 can be reduced, thereby reducing the adverse effects of water vapor in the connection layer 15 on the sub-pixels 12 of the display area 111 more effectively, and further improving the display effect of the display panel.

In some embodiments, referring to FIG. 1B, the display panel further comprises a first planarization layer 17. The first planarization layer 17 is located at the display area 111 and the peripheral area 112. The first planarization layer 17 comprises a first planarization portion 171 located between the driving circuit 13 and the connection layer 15. It should be understood that, for the purpose of description here, a portion of the first planarization layer 17 located between the driving circuit 13 and the connection layer 15 is referred to as the first planarization portion 171. The material of the first planarization layer 17 may comprise, for example, organic insulating materials such as polyimide or resin materials.

The inventors have noticed that the first planarization layer 17 might release gases such as hydrogen gas or water vapor in subsequent processes (for example, high-temperature processes, or the like). The gas released by the first planarization layer 17 is likely to cause other film layers such as the connection layer 15 above the first planarization layer 17 deform and further generate cracks, thereby resulting in that water vapor or oxygen enters the display area 111 through the cracks and affecting the display effect of the display panel.

In view of the above, the embodiments of the present disclosure further provide the following solutions, which will be introduced below in conjunction with FIG. 2.

Figure 2:
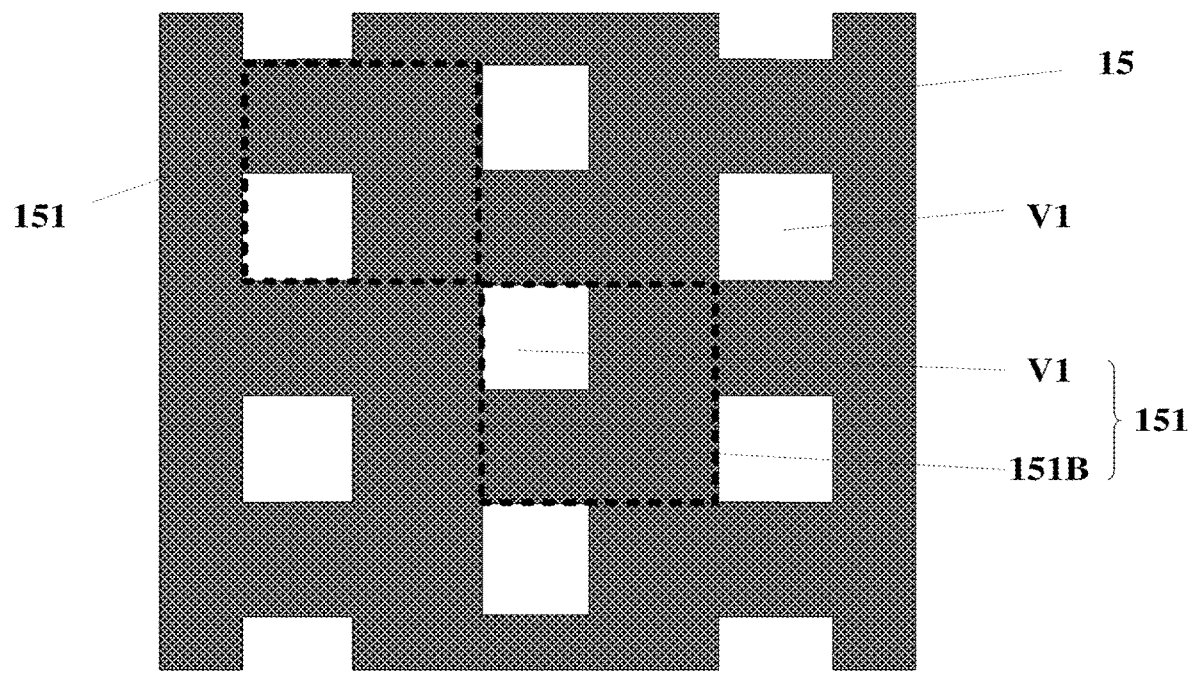
FIG. 2 is a schematic partial top view showing a connection layer in a display panel according to an embodiment of the present disclosure.

FIG. 2 is a schematic partial top view showing a connection layer in a display panel according to an embodiment of the present disclosure.

As shown in FIG. 2, the connection layer 15 comprises a plurality of first openings V1 spaced apart from each other. Referring to FIG. 1B, the orthographic projections of the plurality of first openings V1 on the base substrate 11 at least partially overlaps with the orthographic projection of the first planarization portion 171 on the base substrate 11.

In the above embodiments, the plurality of first openings V1 are beneficial to release the gas released by the first planarization portion 171, thereby reducing the possibility of cracks appearing in the connection layer 15 and further improving the display effect of the display panel.

In some embodiments, referring to FIG. 2, the connection layer 15 comprises a plurality of areas 151 adjacent to each other. Each region 151 of the plurality of regions 151 comprises one first opening V1 of the plurality of first openings V1 and a non-opening area 151B other than the one first opening V1. The ratio of the area of the orthographic projection of the first opening V1 in each area 151 on the base substrate 11 to the area of the orthographic projection of each area 151 on the base substrate 11 ranges from 18% to 31%, for example, 18%, 25%, 28%, 30%, 31% and so on.

In the above embodiments, the density of the plurality of first openings V1 of the connection layer 15 is increased such that the possibility of cracks appearing in the connection layer 15 may be further reduced, so as to further improve the display effect of the display panel.

In some embodiments, the orthographic projections of the plurality of regions 151 on the base substrate 11 have a same area, and the orthographic projections of the plurality of first openings V1 of the connection layer 15 on the base substrate 11 have a same area. In this manner, the plurality of first openings V1 can release the gas released by the first planarization portion 171 more uniformly, which is more beneficial to reduce the possibility of cracks appearing in the connection layer 15.

As some implementations, the orthographic projection of each first opening V1 on the base substrate 11 is in a shape of square. As some implementations, the orthographic projection of each area 151 on the base substrate 11 is in a shape of square. It should be understood that the embodiments of the present disclosure are not limited thereto, and in other implementations, the orthographic projections of the first opening V1 and the area 151 on the base substrate 11 may also be in other shapes. As some examples, in the case where the orthographic projection of the first opening V1 on the base substrate 11 is in a shape of square, the side length of the square may range from 12 microns to 20 microns, such as 12 microns, 15 microns, 16 microns, 18 microns, 20 microns, or the like.

Some implementations of electrical connection of the connection layer 15 to the power line 14 and the cathode will be introduced below.

In some implementations, referring to FIG. 1B, the first planarization layer 17 comprises a second opening V2 located at the peripheral area 112 and extending along a periphery of the display area 111. The display panel further comprises a first conductive portion CT1 located in the second opening V2 and a pixel defining layer 18 located on one side of the connection layer 15 away from the base substrate 11.

The first conductive portion CT1 is located between the power line 14 and the connection layer 15, and the first conductive portion CT1 is in contact with the power line 14 and the connection layer 15 respectively. The pixel defining layer 18 comprises a first pixel defining portion 181 located at the peripheral area 112. Here, the first pixel defining portion 181 comprises a plurality of filling portions 181A spaced apart from each other and located at the plurality of first openings V1 in a one-to-one correspondence. For example, each filling portion 181A completely fills a corresponding first opening V1. In other words, the orthographic projection of each first opening V1 on the base substrate 11 is within the orthographic projection of a corresponding filling portion 181A on the base substrate 11.

The cathode 16 is in contact with a portion of the connection layer 15 that is not covered by the pixel defining layer 18. Since the connection layer 15 is in contact with the first conductive portion CT1, and the first conductive portion CT1 is in contact with the power line 14, the electrical connection between the cathode 16 and the power line 14 is achieved.

The inventors have also noticed that the stack of a plurality of planarization layers is more likely to cause cracks appearing in the connection layer 15, thereby reducing the display effect of the display panel.

Accordingly, the embodiments of the present disclosure further provide the following solutions.

In some embodiments, referring to FIG. 1B, the gate driving circuit 131 comprises a first clock signal line CB and a second clock signal line CK located between the first clock signal line CB and the display area 111. The first planarization portion 171 comprises a third opening V3 located above the first clock signal line CB and a fourth opening V4 located above the second clock signal line CK. In these embodiments, the display panel further comprises a second conductive portion CT2, a third conductive portion CT3, and a second planarization layer 19.

The second conductive portion CT2 is located in the third opening V3, and in contact with the first clock signal line CB. The third conductive portion CT3 is located in the fourth opening V4, and in contact with the second clock signal line CK.

The second planarization layer 19 is located on one side of the first planarization layer 17 away from the base substrate 11. The second planarization layer 19 comprises a second planarization portion 192 and a third planarization portion 193 spaced apart from the second planarization portion 192. The second planarization portion 192 is located between the first planarization portion 171 and the connection layer 15 and covers the second conductive portion CT2 and the third conductive portion CT3. In other words, the orthographic projections of the second conductive portion CT2 and the third conductive portion CT3 on the base substrate 11 are within the orthographic projection of the second planarization portion 192 on the base substrate 11.

The third planarization portion 193 is located on one side of the light-emitting control driving circuit 132 away from the display area 111. The third planarization portion 193 comprises a fifth opening V5 located above the first conductive portion CT1. The connection layer 15 is partially located in the fifth opening V5, and a portion of the connection layer 15 located between the third planarization portion 193 and the second planarization portion 192 is at least partially in contact with the first planarization layer 17.

In the above embodiments, the second planarization portion 192 and the third planarization portion 193 in the second planarization layer 19 are spaced apart from each other, thus reducing the area of an overlapping region between the second planarization layer 19 and the first planarization layer 17. Such a display panel is more favorable for reducing the water vapor released by the film layers below the connection layer 15, thereby reducing the possibility of cracks appearing in the connection layer 15, and further improving the display effect of the display panel.

In some embodiments, the maximum thickness of a portion of the second planarization portion 192 in contact with first planarization layer 17 is smaller than the maximum thickness of a portion of the third planarization portion 193 in contact with first planarization layer 17. In other words, the second planarization portion 192 as a whole is thinner than the third planarization portion 193. It should be understood that the thickness of the second planarization portion 192/third planarization portion 193 refers to the thickness of the second planarization portion 192/third planarization portion 193 in a direction perpendicular to the surface of the base substrate 11.

In the above embodiments, the second planarization portion 192 as a whole is thinner than the third planarization portion 193. Such a display panel is beneficial to reduce the possibility that the filling portion 118A cannot completely fill the corresponding first opening V1 due to the exposure process of forming the filling portion 118A, thereby reducing the possibility of fracture of the cathode 16, and improving the display effect of the display panel.

As some implementations, the thickness of the second planarization portion 192 is greater than or equal to 1 micrometer and less than 1.5 micrometers, for example, 1.2 micrometers, 1.4 micrometers, or the like. As some implementations, the thickness of the third planarization portion 193 is greater than or equal to 1.5 microns and less than or equal to 2 microns, for example, 1.6 microns, 1.8 microns, or the like.

Some implementations of the pixel driving circuit 123 will be introduced below.

In some embodiments, referring to FIG. 2A, the pixel driving circuit 123 comprises a second active layer 1231, a second gate 1232, an interlayer insulating layer 1233, a first electrode 1234 and a second electrode 1235. It should be understood that the pixel driving circuit 123 further comprises a gate insulating layer 1236 located between the second active layer 1231 and the second gate 1232. The second active layer 1231 is located on one side of the base substrate 11 close to the anode 121, that is, located between the base substrate 11 and the anode 121. The second gate 1232 is located on one side of the second active layer 1231 away from the base substrate 11. The interlayer insulating layer 1233 is located on one side of the second gate 1232 away from the base substrate 11 and covers the second gate 1232. The first electrode 1234 and the second electrode 1235 are located on one side of the interlayer insulating layer 1233 away from the base substrate 11, and electrically connected to the second active layer 1231. For example, the first electrode 1234 and the second electrode 1235 are electrically connected to the second active layer 1231 through a via hole penetrating the interlayer insulating layer 1233 and the gate insulating layer 1236 respectively.

The first planarization layer 17 is located on one side of the interlayer insulating layer 1233 away from the base substrate 11, and further comprises a sixth opening V6 located at the display area 111. The display panel further comprises a fourth conductive portion CT4 located in the sixth opening V6 and in contact with the first electrode 1234.

The second planarization layer 19 further comprises a fourth planarization portion 194 spaced apart from the second planarization portion 192, and located on one side of the second planarization portion 192 away from the third planarization portion 193. The fourth planarization portion 194 comprises a seventh opening V7 located at the display area 111, and the anode 121 is partially located in the seventh opening V7. Here, the fourth planarization portion 194 may be regarded as extending from the display area 111 to the peripheral area 112.

In the above embodiments, the second planarization portion 192 and the fourth planarization portion 194 in the second planarization layer 19 are spaced apart from each other, thus further reducing the area of the overlapping area between the second planarization layer 19 and the first planarization layer 17. Such a display panel is more favorable for reducing the water vapor released by the film layers below the connection layer 15, thereby reducing the possibility of cracks appearing in the connection layer 15, and further improving the display effect of the display panel.

In some embodiments, the maximum thickness of the portion of the second planarization portion 192 in contact with first planarization layer 17 is smaller than the maximum thickness of the portion of the fourth planarization portion 194 in contact with first planarization layer 17. For example, the maximum thickness of the portion of the second planarization portion 192 in contact with first planarization layer 17 is equal to the maximum thickness of the portion of the third planarization portion 193 in contact with first planarization layer 17.

In some embodiments, at least one of the first conductive portion CT1, the second conductive portion CT2, or the third conductive portion CT3 is located in a same layer as the fourth conductive portion CT4. For example, each of the first conductive portion CT1, the second conductive portion CT2, and the third conductive portion CT3 is located in a same layer as the fourth conductive portion CT4. In some embodiments, at least one of the power line 14, the first clock signal line CB, and the second clock signal line CK is located in a same layer as the first electrode 1234. For example, each of the power line 14, the first clock signal line CB, and the second clock signal line CK is located in a same layer as the first electrode 1234. In some embodiments, the connection layer 15 is located in a same layer as the anode 121.

It should be noted that in the embodiments of the present disclosure, the expression that a plurality of components is located in a same layer means that the plurality of components is formed by performing a patterning process on a same material layer. Therefore, the plurality of components has the same material, and has substantially a same thickness. For example, the connection layer 15 and the anode 121 have a same material and have substantially a same thickness.

In some embodiments, referring to FIG. 1B, the first planarization layer 17 further comprises an eighth opening V8 located at the peripheral area 112, and located between the gate driving circuit 131 and the display area 111. The display panel further comprises an initialization line 20 and a fifth conductive portion CT5. Here, the initialization line 20 is located between the interlayer insulating layer 1233 and the first planarization layer 17, and located between the gate driving circuit 131 and the display area 111. The fifth conductive portion CT5 is located in the eighth opening V8, and in contact with the initialization line 20. The initialization line 20 is configured to provide an initialization signal to the plurality of sub-pixels 12.

In some embodiments, referring to FIG. 1B, the display panel further comprises a passivation layer 22 located on one side of the interlayer insulating layer 1233 away from the base substrate 11. For example, the passivation layer 22 comprises a plurality of openings communicating with the second opening V2, the third opening V3, the fourth opening V4, the sixth opening V6, and the eighth opening V8 respectively. Correspondingly, the first conductive portion CT1, the second conductive portion CT2, the third conductive portion CT3, the fourth conductive portion CT4, and the fifth conductive portion CT5 are respectively located at the plurality of openings of the passivation layer 22.

In some embodiments, referring to FIG. 1B, the pixel defining layer 18 further comprises a second pixel defining portion 182 located on one side of the first pixel defining portion 181 away from the power line 14. The second pixel defining portion 182 comprises a ninth opening V9 located at the display area 111 and located above the anode 121, and the light-emitting function layer 122 is located in the ninth opening V9 and in contact with the anode 121.

In some embodiments, referring to FIG. 1B, the first planarization layer 17 comprises a tenth opening V10 extending along the periphery of the display area 111, and located between the light-emitting control driving circuit 132 and the gate driving circuit 131. The tenth opening V10 is beneficial to block the transmission of water vapor to the display area 111.

In some embodiments, referring to FIG. 1B, the display panel may further comprise a first dam 22 and a second dam 23. Each of the first dam 22 and the second dam 23 may comprise a plurality of layers. At least one of plurality of layers may be located in a same layer as at least one of the first planarization layer 17, the second planarization layer 19, or the pixel defining layer 18.

Figure 3A:
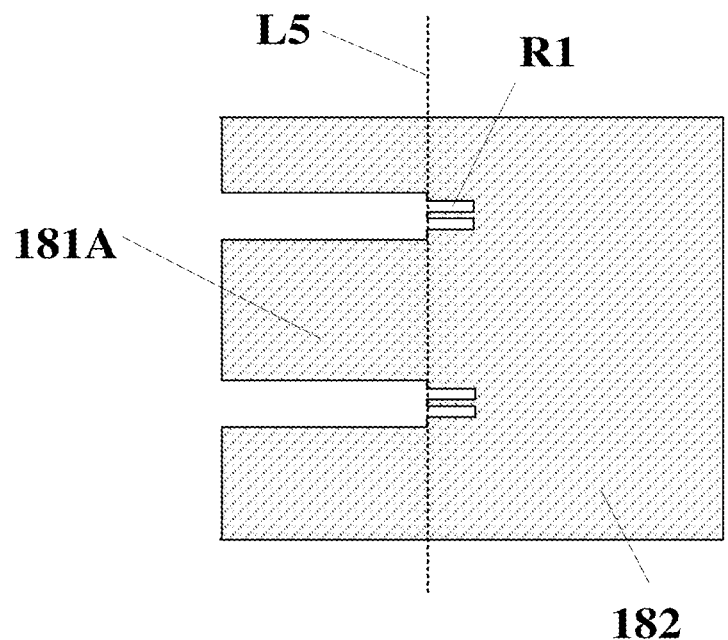
FIG. 3A is a schematic partial view showing a layout of a second pixel defining portion according to an embodiment of the present disclosure.
Figure 3B:
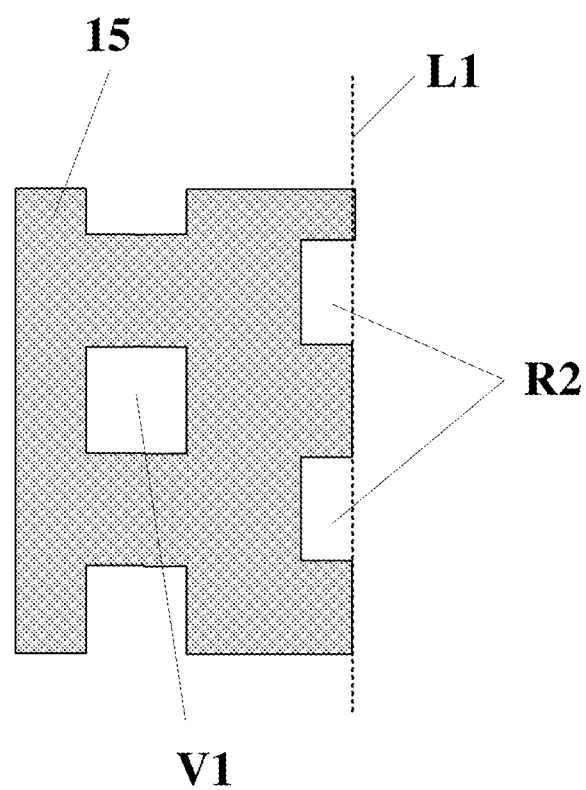
FIG. 3B is a schematic partial view showing a layout of a connection layer according to an embodiment of the present disclosure.
Figure 3C:
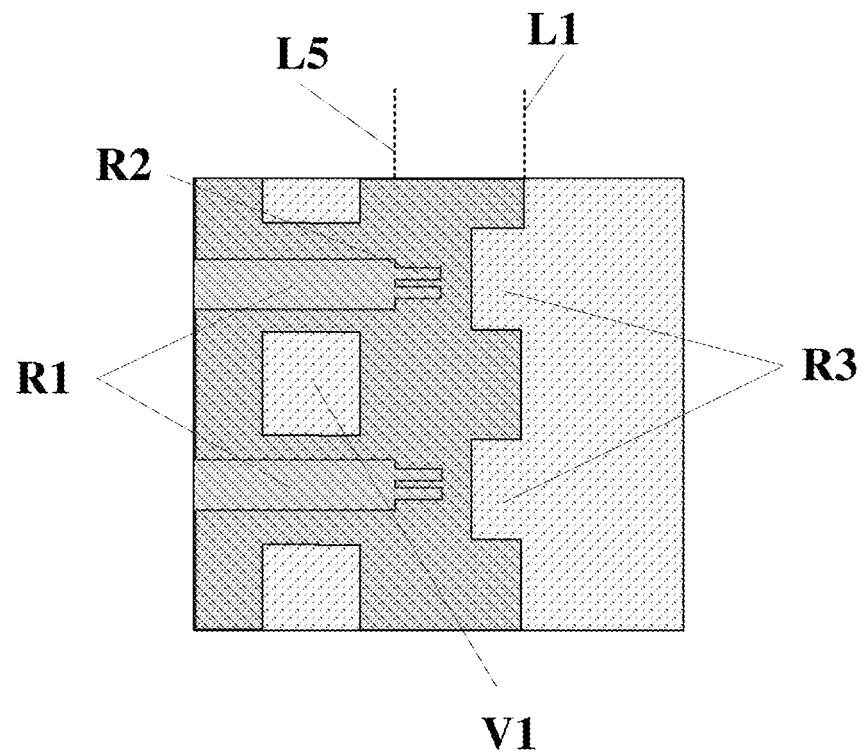
FIG. 3C is a schematic view showing a layout in which a second pixel defining portion is superimposed with a connection layer according to an embodiment of the present disclosure.

FIG. 3A is a schematic partial view showing a layout of a second pixel defining portion according to an embodiment of the present disclosure. FIG. 3B is a schematic partial view showing a layout of a connection layer according to an embodiment of the present disclosure. FIG. 3C is a schematic view showing a layout in which a second pixel defining portion is superimposed with a connection layer according to an embodiment of the present disclosure.

In some embodiments, referring to FIGS. 3A-3C, the edge L1 of the orthographic projection of the connection layer 15 on the base substrate 11 that is close to the display area 111 is located between the edge L5 of the orthographic projection of the second pixel defining portion 182 on the base substrate 11 that is away from the display area and the display area 111.

In some embodiments, referring to FIGS. 3A and 3C, the edge L5 of the orthographic projection of the second pixel defining portion 182 on the base substrate 11 that is away from the display area has a plurality of first recesses R1. The orthographic projections of the plurality of first recesses R1 on the base substrate 11 do not overlap with the orthographic projections of the plurality of first openings V1 on the base substrate 11. For example, the plurality of first recesses R1 extend along a direction from the peripheral area 112 to the display area 111. For example, the orthographic projections of the first recess R1 on the base substrate 11 are in a shape of rectangular. The plurality of first recesses R1 are beneficial to reduce the thickness of the edge of the second pixel defining portion 182 gradually rather than abruptly, thereby reducing the possibility of fracture of the cathode 16 and improving the display effect of the display panel.

In some embodiments, referring to FIGS. 3B and 3C, the orthographic projection of the connection layer 15 on the base substrate 11 has a plurality of second recesses R2 close to an edge of the display area 111. The plurality of second recesses R2 are beneficial to blocking the transmission of water vapor in the connection layer 15 to the display area 111, thereby improving the display effect of the display panel.

Some implementations that the edge L1 of the orthographic projection of the connection layer 15 on the base substrate 11 that is close to the display area 111 overlaps with the gate driving circuit 131 will be introduced below in conjunction with some implementations of the gate driving circuit 131.

Figure 4:
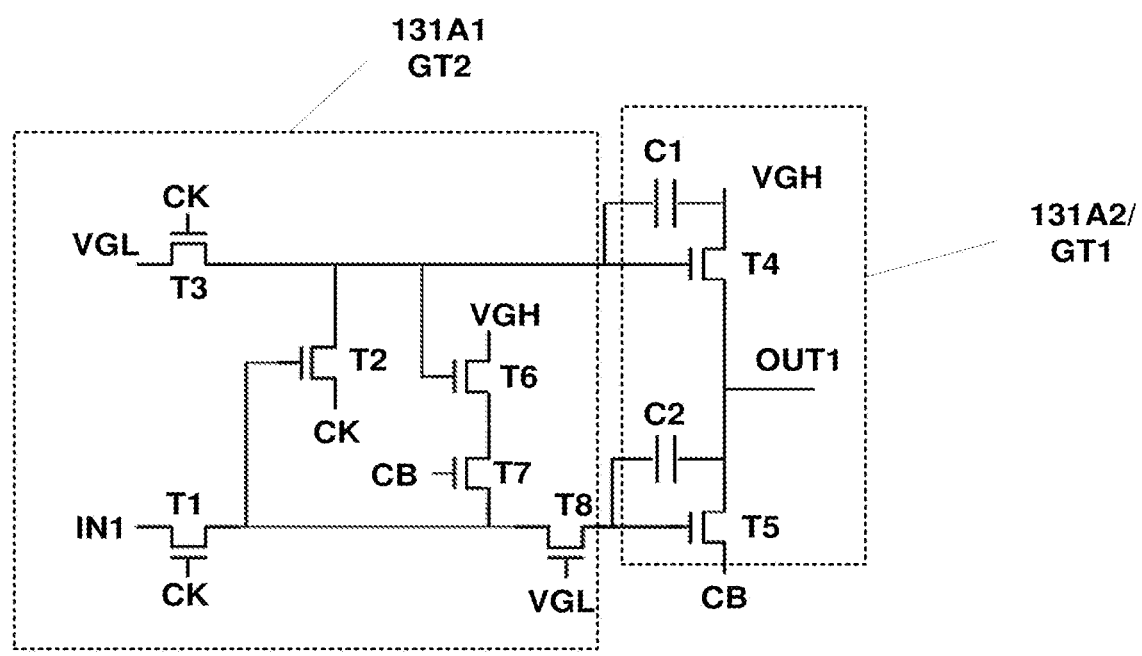
FIG. 4 is a schematic circuit view showing a gate driving unit according to an embodiment of the present disclosure.

FIG. 4 is a schematic circuit view showing a gate driving unit according to an embodiment of the present disclosure. FIGS. 5A-5D are schematic views showing a layout of a gate driving unit according to an embodiment of the present disclosure. FIG. 6 is a schematic view showing a partial layout of a connection layer and a gate driving unit according to an embodiment of the present disclosure.

Referring to FIG. 4 and FIGS. 5A-5D, each gate driving unit 131A comprises a first gate driving sub-circuit 131A1 and a second gate driving sub-circuit 131A2 electrically connected to the first gate driving sub-circuit 131A1. Here, the second gate driving sub-circuit 131A2 is located between the first gate driving sub-circuit 131A1 and the display area 111.

The first gate driving sub-circuit 131A1 comprises an input terminal IN1 of the gate driving unit 131A, and the second gate driving sub-circuit 131A2 comprises an output terminal OUT1 of the gate driving unit 131A. The orthographic projection of the second gate driving sub-circuit 131A2 on the base substrate 11 overlaps with the edge L1 of the orthographic projection of the connection layer 15 on the base substrate 11 that is close to the display area 111.

Implementations of the first gate driving sub-circuit 131A1 and the second gate driving sub-circuit 131A2 will be introduced below.

First, the implementations of the second gate driving sub-circuit 131A2 will be introduced.

Referring to FIG. 4 and FIG. 5A-5D, the second gate driving sub-circuit 131A2 comprises a first capacitor C1, a second capacitor C2 and a first group of transistors GT1. The first group of transistors GT1 comprises a fourth transistor T4 and a fifth transistor T5. Each of the first group of transistors GT1 comprises a first gate and a first active layer. The first active layer comprises a first electrode area, a second electrode area, and a channel area located between the first electrode area and the second electrode area. For example, the fourth transistor T4 comprises a first gate T40, and the first active layer of the fourth transistor T4 comprises a first electrode area T41, a second electrode area T42, and a channel area T43 located between the first electrode area T41 and the second electrode area T42. For another example, the fifth transistor T5 comprises a first gate T50, and the first active layer of the fifth transistor T5 comprises a first electrode area T51, a second electrode area T52, and a channel area T53 located between the first electrode area T51 and the second electrode area T52.

It should be understood that the region of the first active layer of each of the first group of transistors GT1 covered by the first gate is the channel area, and the region of the first active layer of each of the first group of transistors GT1 not covered by the first gate comprises the first electrode area and the second electrode area. As some implementation, the material of the first active layer may comprise, for example, polysilicon, such as low temperature polysilicon (LIPS).

Figure 5A:
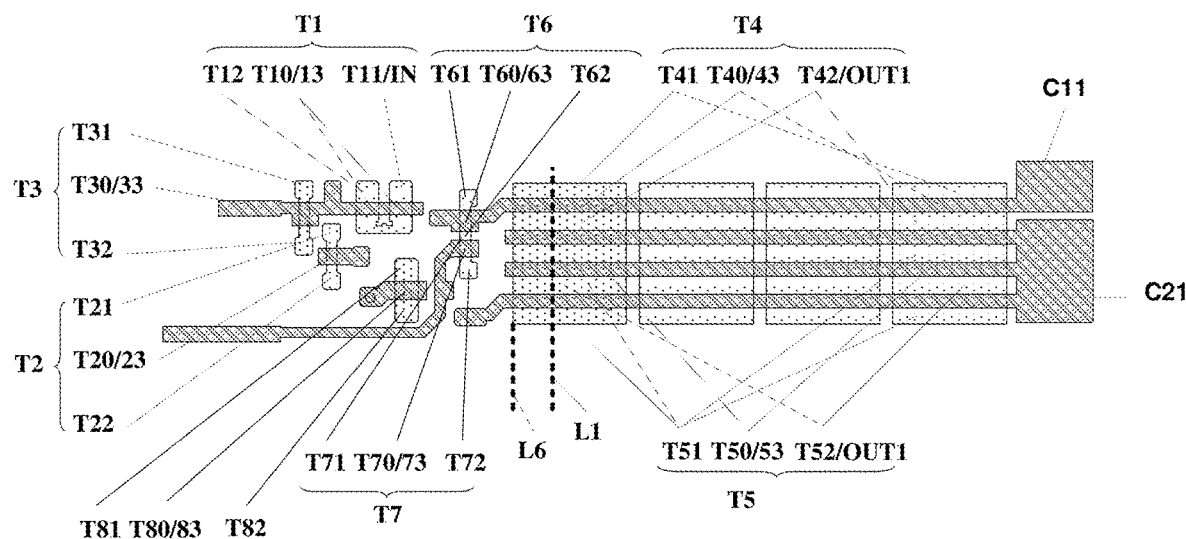
FIGS. 5A-5D are schematic views showing a layout of a gate driving unit according to an embodiment of the present disclosure.
Figure 5B:
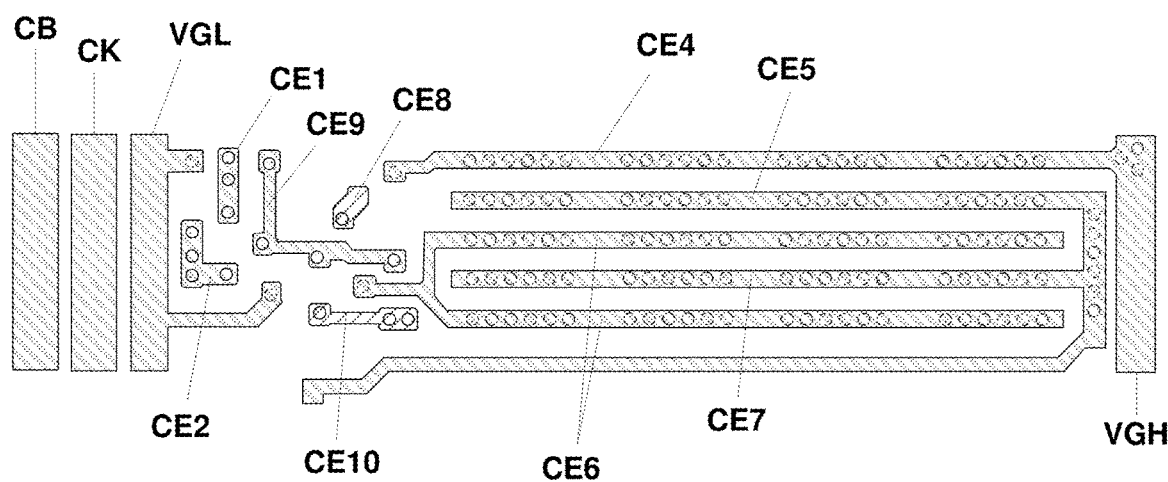
Figure 5C:
Figure 5D:
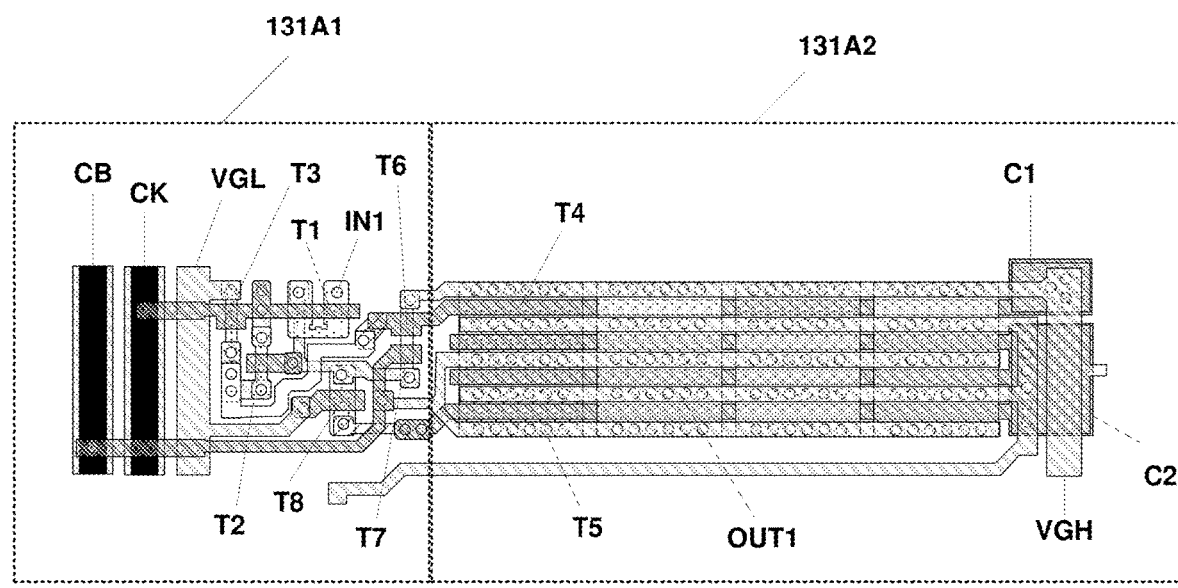
Figure 6:
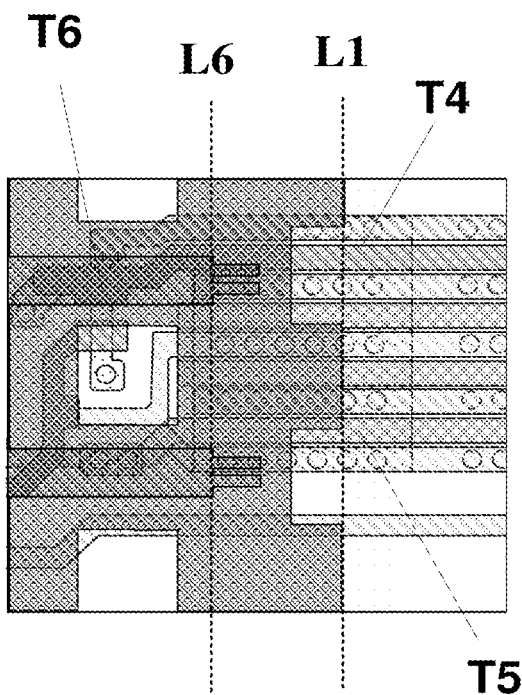
FIG. 6 is a schematic view showing a partial layout of a connection layer and a gate driving unit according to an embodiment of the present disclosure.

The first capacitor C1 comprises the first electrode plate C11 shown in FIG. 5A and the second electrode plate C12 shown in FIG. 5C. The second electrode plate C12 of the first capacitor C1 is electrically connected to a first power signal line VGH configured to provide a first power voltage. For example, the second electrode plate C12 of the first capacitor C1 is electrically connected to the first power signal line VGH through a via hole.

The second capacitor C2 comprises the first electrode plate C21 shown in FIG. 5A and the second electrode plate C22 shown in FIG. 5C, and the second electrode plate C22 of the second capacitor C2 is electrically connected to the output terminal OUT1. For example, the second electrode plate C22 of the second capacitor C2 is electrically connected to the output terminal OUT1 through a connection electrode CE7 shown in FIG. 5B.

The first gate T40 of the fourth transistor T4 is electrically connected to the first electrode plate C11 of the first capacitor C1, and the first electrode area T41 of the fourth transistor T4 is electrically connected to the first power signal line VGH. For example, the first gate T40 of the fourth transistor T4 and the first electrode plate C11 of the first capacitor C1 are provided integrally. For example, the first electrode area T41 of the fourth transistor T4 is electrically connected to the first power signal line VGH through a connection electrode CE4 shown in FIG. 5B. For example, the connection electrode CE4 and the first power signal line VGH are provided integrally. For example, the second electrode area T42 of the fourth transistor T4 is electrically connected to the output terminal OUT through a connection electrode CE5 shown in FIG. 5B.

The first gate T50 of the fifth transistor T5 is electrically connected to the first electrode plate C21 of the second capacitor C2, and the first electrode area T51 of the fifth transistor T5 is electrically connected to the first clock signal line CB configured to provide the first clock signal, and one of the second electrode area T52 of the fifth transistor T5 and the second electrode area T42 of the fourth transistor T4 serves as the output terminal OUT1. For example, the first gate T50 of the fifth transistor T5 and the first electrode plate C21 of the second capacitor C2 are provided integrally. The first electrode area T51 of the fifth transistor T5 is electrically connected to the first clock signal line CB through a connection electrode CE6 shown in FIG. 5C. For example, the second electrode area T52 of the fifth transistor T5 is electrically connected to a connection electrode CE7 shown in FIG. 5C to output a gate driving signal.

The orthographic projections of the fourth transistor T4 and the fifth transistor T5 on the base substrate 11 overlap with the edge L1 of the orthographic projection of the connection layer 15 on the base substrate 11 that is close to the display area 111. The orthographic projections of the first capacitor C1 and the second capacitor C2 on the base substrate 11 do not overlap with the edge L1 of the orthographic projection of the connection layer 15 on the base substrate 11 that is close to the display area 111.

Referring to FIGS. 5A and 6, the distance between the edge L6 of the orthographic projection of the first active layers of each of the fourth transistor T4 and the fifth transistor T5 on the base substrate 11 that is away from the display area 11 and the edge L1 of the orthographic projection of the connection layer 15 on the base substrate 11 that is close to the display area 111 ranges from 15 micrometers to 25 micrometers, for example, 18 micrometers, 22 micrometers, or the like. For example, the first active layer of each of the fourth transistor T4 and the fifth transistor T5 comprises a plurality of active portions spaced apart from each other, so as to facilitate heat dissipation.

In some embodiments, the second gate driving sub-circuit 131A2 further comprises a first power signal line VGH. For example, the first power signal line VGH is located on one side of the fourth transistor T4 and the fifth transistor T5 close to the display area 111.

It should be noted that, the expression that one component or region/area is connected to another component or region/area through a connection electrode herein may be understood as that: one component or region/area is electrically connected to one end of the connection electrode through one or more via holes, and the another component or region/area is electrically connected to the other end of the connection electrode through another one or more via holes.

Next, the implementations of the first gate driving sub-circuit 131A1 will be introduced.

The first gate driving sub-circuit 131A1 comprises a second group of transistors GT2. Similarly, each of the second group of transistors GT2 comprises a first gate and a first active layer. Similarly, the first active layer comprises a first electrode area, a second electrode area, and a channel area located between the first electrode area and the second electrode area.

The second group of transistors GT2 comprises a first transistor T1, a second transistor T2, a third transistor T3, a sixth transistor T6, a seventh transistor T7, and an eighth transistor T8.

The first gate T10 of the first transistor T1 is electrically connected to a second clock signal line CK configured to provide a second clock signal, and the first electrode area T10 of the first transistor T1 serves as the input terminal IN1.

The first gate T20 of the second transistor T2 is electrically connected to the second electrode area T12 of the first transistor T1, and the first electrode area T21 of the second transistor T2 is electrically connected to the first gate T10 of the first transistor T1. For example, the first gate T20 of the second transistor T2 is electrically connected to the second electrode area T12 of the first transistor T1 through a connection electrode CE9 shown in FIG. 5B. For example, the first electrode area T21 of the second transistor T2 is electrically connected to the first gate T10 of the first transistor T1 through a connection electrode CE1 shown in FIG. 5B.

The first gate T30 of the third transistor T3 is electrically connected to the first gate T10 of the first transistor T1, and the first electrode area T31 of the third transistor T3 is electrically connected to a second power signal line VGL configured to receive a second power voltage, and the second electrode area T32 of the third transistor T3 is electrically connected to the second electrode area T22 of the second transistor T2. For example, the second power voltage is smaller than the first power voltage. For example, the first gate T30 of the third transistor T3 and the first gate T10 of the first transistor T1 are provided integrally, and the first gate T30 of the third transistor T3 is electrically connected to the second clock signal line CK through a via hole. For example, the second electrode area T32 of the third transistor T3 is electrically connected to the second electrode area T22 of the second transistor T2 through a connection electrode CE2 shown in FIG. 5B.

The first gate T60 of the sixth transistor T6 is electrically connected to the second electrode area T22 of the second transistor T2, the second electrode area T32 of the third transistor T3, and the first gate T40 of the fourth transistor T4, and the first electrode area T61 of the sixth transistor T6 is electrically connected to the first electrode area T41 of the fourth transistor T4. For example, the first gate electrode T60 of the sixth transistor T6 is electrically connected to the second electrode area T22 of the second transistor T2 and the second electrode area T32 of the second transistor T3 through a connection electrode CE8 and a connection electrode CE2 shown in FIG. 5B, and a connection electrode CE3 shown in FIG. 5C.

The first gate T70 of the seventh transistor T7 is electrically connected to the first electrode area T51 of the fifth transistor T5, the first electrode area T71 of the seventh transistor T7 is electrically connected to the second electrode area T62 of the sixth transistor T6, the second electrode area T72 of the seventh transistor T7 is electrically connected to the first gate T20 of the second transistor T2. For example, the second electrode area T72 of the seventh transistor T7 is electrically connected to the first gate T20 of the second transistor T2 through a connection electrode CE9 shown in FIG. 5B.

The first gate T80 of the eighth transistor T8 is electrically connected to the second power signal line VGL, the first electrode area T81 of the eighth transistor T8 is electrically connected to the first gate T20 of the second transistor T2, and the second electrode area T82 of the eighth transistor T8 is electrically connected to the first gate T50 of the fifth transistor T5. For example, the first electrode area T81 of the eighth transistor T8 is electrically connected to the first gate T20 of the second transistor T2 through a connection electrode CE9 shown in FIG. 5C. For example, the second electrode area T82 of the eighth transistor T8 is electrically connected to the first gate T50 of the fifth transistor T5 through a connection electrode CE10 shown in FIG. 5C.

In some embodiments, the first gate driving sub-circuit 131A1 further comprises a first clock signal line CB, a second clock signal line CK, and a second power signal line VGL. For example, the second power signal line VGL is located on one side of the second group of transistors GT2 away from the display area 111, the first clock signal line CB is located on one side of the second power signal line VGL away from the display area 111, and the second clock signal line CK is located at between the first clock signal line CB and the second power signal line VGL.

Figure 7:
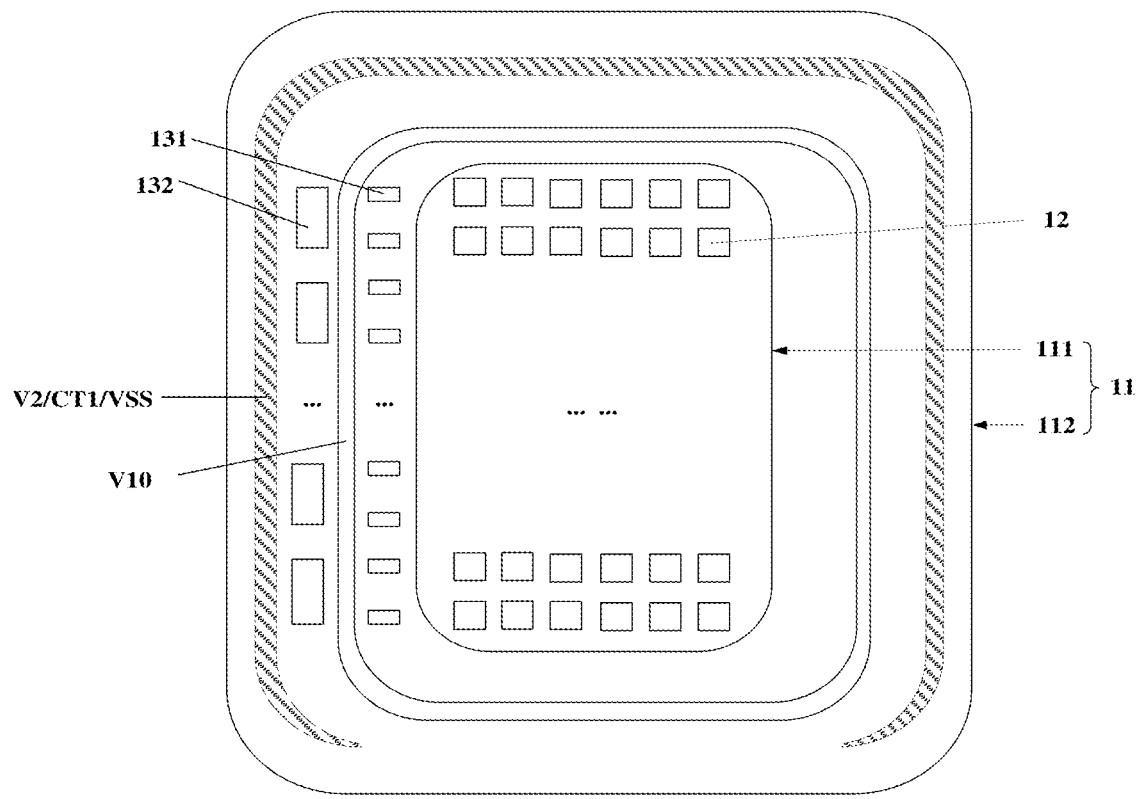
FIG. 7 is a schematic top view showing a display panel according to another embodiment of the present disclosure.

FIG. 7 is a schematic top view showing a display panel according to another embodiment of the present disclosure.

In some embodiments, referring to FIG. 7, the orthographic projection of the tenth opening V10 on the base substrate 11 is an enclosed ring surrounding the display area 111.

In some embodiments, referring to FIG. 7, the orthographic projection of the second opening V2 on the base substrate 11 is a non-enclosed ring surrounding the display area 111.

The present disclosure also provides a display device, which may comprise the display panel according to any one of the above embodiments. In some embodiments, the display device may be any product or member having a display function, such as a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising:
   a base substrate comprising a display area and a peripheral area surrounding the display area;
   a plurality of sub-pixels located at the display area, wherein each of the plurality of sub-pixels comprises an anode located on one side of the base substrate and a light-emitting function layer located on one side of the anode away from the base substrate;
   a driving circuit located at the peripheral area, and configured to output a gate driving signal and a light-emitting control scanning signal to the plurality of sub-pixels;
   a power line located on one side of the driving circuit away from the display area;
   a connection layer electrically connected to the power line and located on one side of the driving circuit and the power line away from the base substrate, wherein an orthographic projection of the connection layer on the base substrate partially overlaps with an orthographic projection of the driving circuit on the base substrate, and a minimum distance between an edge of the orthographic projection of the connection layer on the base substrate close to the display area and an edge of an orthographic projection of the anode, which is closest to an edge of the display area of a plurality of anodes of the plurality of sub-pixels, on the base substrate ranges from 150 microns to 250 microns; and
   a cathode electrically connected to the connection layer, located at the display area and the peripheral area, and located on one side of the light-emitting function layer and the connection layer away from the base substrate,
   wherein the driving circuit comprises a gate driving circuit located between the display area and the power line, and configured to output the gate drive signal to the plurality of sub-pixels, wherein the edge of the orthographic projection of the connection layer on the base substrate close to the display area is at leas partially located within an orthographic projection of the gate driving circuit on the base substrate, and
   wherein the gate driving circuit comprises a plurality of a gate driving units, each of the plurality of gate driving units comprising:
   a first gate driving sub-circuit comprising an input terminal of the each of the plurality of gate driving units, and
   a second gate driving sub-circuit electrically connected to the first gate driving sub-circuit, located between the first gate driving sub-circuit and the display area, and comprising an output terminal of the each of the plurality of gate driving units, wherein an orthographic projection of the second gate driving sub-circuit on the base substrate overlaps with the edge of the orthographic projection of the connection layer on the base substrate close to the display area.

2. The display panel according to claim 1, wherein the driving circuit comprises:
   a light-emitting control driving circuit located between the power line and the gate driving circuit, and configured to output the light-emitting control scanning signal to the plurality of sub-pixels.

3. The display panel according to claim 2, wherein:
   a distance between the edge of the orthographic projection of the connection layer on the base substrate close to the display area and an edge of the orthographic projection of the gate driving circuit on the base substrate away from the display area is a first distance; and
   a distance between the edge of the orthographic projection of the connection layer on the base substrate close to the display area and an edge of the orthographic projection of the gate driving circuit on the base substrate close to the display area is a second distance approximately equal to the first distance.

4. The display panel according to claim 2, further comprising:
   a first planarization layer located at the display area and the peripheral area, and comprising a first planarization portion located between the driving circuit and the connection layer,
   wherein the connection layer comprises a plurality of first openings spaced apart from each other, wherein orthographic projections of the plurality of first openings on the base substrate at least partially overlap with an orthographic projection of the first planarization portion on the base substrate.

5. The display panel according to claim 4, wherein the connection layer comprises a plurality of regions adjacent to each other, wherein:
   each of the plurality of regions comprises one of the plurality of first openings and a non-opening area other than the one of the plurality of first openings, and
   a ratio of an area of an orthographic projection of the one of the plurality of first openings in the each of the plurality of regions on the base substrate to an area of an orthographic projection of the each of the plurality of regions on the base substrate ranges from 18% to 31%.

6. The display panel according to claim 5, wherein orthographic projections of the plurality of regions on the base substrate have a same area, and orthographic projections of the plurality of first openings on the base substrate have a same area.

7. The display panel according to claim 4, wherein:
   the first planarization layer comprises a second opening located at the peripheral area and extending along a periphery of the display area; and
   the display panel further comprises:
   a first conductive portion located in the second opening, located between the power line and the connection layer, and in contact with the power line and the connection layer, and
   a pixel defining layer located on one side of the connection layer away from the base substrate, and comprising a first pixel defining portion located at the peripheral area, wherein the first pixel defining portion comprises a plurality of filling portions spaced apart from each other, and located in the plurality of first openings in a one-to-one correspondence, and the cathode is in contact with a portion of the connection layer not covered by the pixel defining layer.

8. The display panel according to claim 7, wherein:
   the gate driving circuit comprises a first clock signal line and a second clock signal line located on one side of the first clock signal line away from the display area;
   the first planarization portion comprises a third opening located above the first clock signal line and a fourth opening located above the second clock signal line; and
   the display panel further comprises:
   a second conductive portion located in the third opening and in contact with the first clock signal line,
   a third conductive portion located in the fourth opening and in contact with the second clock signal line,
   a second planarization layer located on one side of the first planarization layer away from the base substrate, and comprising:
   a second planarization portion located between the first planarization portion and the connection layer, and covering the second conductive portion and the third conductive portion, and
   a third planarization portion spaced apart from the second planarization portion, located on one side of the light-emitting control driving circuit away from the display area, and comprising a fifth opening located above the first conductive portion, wherein the connection layer is partially located in the fifth opening, and a portion of the connection layer located between the third planarization portion and the second planarization portion is at least partially in contact with the first planarization layer.

9. The display panel according to claim 8, wherein a maximum thickness of a portion of the second planarization portion in contact with the first planarization layer is smaller than a maximum thickness of a portion of the third planarization portion in contact with first planarization layer.

10. The display panel according to claim 8, wherein:
    a thickness of the second planarization portion is greater than or equal to 1 micrometer and smaller than 1.5 micrometers; and
    a thickness of the third planarization portion is greater than or equal to 1.5 micrometers and smaller than or equal to 2 micrometers.

11. The display panel according to claim/1, wherein:
    at least one of the plurality of sub-pixels further comprises a pixel driving circuit comprising:
    a first active layer located on one side of the base substrate close to the anode,
    a first gate located on one side of the first active layer away from the base substrate,
    an interlayer insulating layer located on one side of the first gate away from the base substrate and covering the first gate, and
    a first electrode and a second electrode which are located on one side of the interlayer insulating layer away from the base substrate and electrically connected to the first active layer;
    the first planarization layer is located on one side of the interlayer insulating layer away from the base substrate, and further comprises a sixth opening located at the display area;
    the second planarization layer further comprises a fourth planarization portion spaced apart from the second planarization portion, located on one side of the second planarization portion away from the third planarization portion, and comprising a seventh opening located at the display area, wherein the anode is partially located in the seventh opening, and a maximum thickness of a portion of the second planarization portion in contact with the first planarization layer is smaller than a maximum thickness of a portion of the fourth planarization portion in contact with the first planarization layer; and
    the display panel further comprises a fourth conductive portion located in the sixth opening and in contact with the first electrode.

12. The display panel according to claim 11, wherein:
    a material of at least one of the first conductive portion, the second conductive portion, or the third conductive portion is the same as that of the fourth conductive portion;
    a material of at least one of the power line, the first clock signal line, or the second clock signal line is the same as that of the first electrode; and
    a material of the connection layer is the same as that of the anode.

13. The display panel according to claim 11, wherein:
    the first planarization layer further comprises an eighth opening located at the peripheral area and located between the gate driving circuit and the display area; and
    the display panel further comprises:
    an initialization line located between the interlayer insulating layer and the first planarization layer, and located between the gate driving circuit and the display area, and
    a fifth conductive portion located in the eighth opening and in contact with the initialization line.

14. The display panel according to claim 7, wherein the pixel defining layer further comprises:
- a second pixel defining portion located on one side of the first pixel defining portion away from the power line, and comprising a ninth opening located at the display area and located above the anode, wherein the light-emitting function layer is located in the ninth opening and in contact with the anode, wherein:
- the edge of the orthographic projection of the connection layer on the base substrate close to the display area is located between an edge of an orthographic projection of the second pixel defining portion on the base substrate away from the display area and the display area, and
- the edge of the orthographic projection of the second pixel defining portion on the base substrate away from the display area has a plurality of first recesses, wherein orthographic projections of the plurality of first recesses on the base substrate do not overlap with the orthographic projections of the plurality of first openings on the base substrate.

15. The display panel according to claim 4, wherein the first planarization layer comprises a tenth opening extending along a periphery of the display area and located between the light-emitting control driving circuit and the gate driving circuit.

16. The display panel according to claim 1, wherein the second gate driving sub-circuit comprises:
- a first capacitor comprising a first electrode plate and a second electrode plate which is electrically connected to a first power signal line configured to provide a first power voltage;
- a second capacitor comprising a first electrode plate and a second electrode plate which is electrically connected to the output terminal; and
- a first group of transistors, each of which comprising a first gate and a first active layer, wherein the first active layer comprises a first electrode area, a second electrode area, and a channel area located between the first electrode area and the second electrode area, the first group of transistors comprising:
- a fourth transistor, wherein the first gate of the fourth transistor is electrically connected to the first electrode plate of the first capacitor, and the first electrode area of the fourth transistor is electrically connected to the first power signal line, and
- a fifth transistor, wherein the first gate of the fifth transistor is electrically connected to the first electrode plate of the second capacitor, and the first electrode area of the fifth transistor is electrically connected to a first clock signal line configured to provide a first clock signal, wherein one of the second electrode area of the fifth transistor and the second electrode area of the fourth transistor serves as the output terminal,
- wherein orthographic projections of the fourth transistor and the fifth transistor on the base substrate overlap with the edge of the orthographic projection of the connection layer on the base substrate close to the display area, and orthographic projections of the first capacitor and the second capacitor on the base substrate do not overlap with the edge of the orthographic projection of the connection layer on the base substrate close to the display area.

17. The display panel according to claim 16, wherein a distance between an edge of an orthographic projection of the first active layer of each of the fourth transistor and the fifth transistor on the base substrate away from the display area and the edge of the orthographic projection of the connection layer on the base substrate close to the display area ranges from 15 micrometers to 25 micrometers.

18. The display panel according to claim 16, wherein the first gate driving sub-circuit comprises a second group of transistors, each of which comprising a second gate and a second active layer, wherein the second active layer comprises a third electrode area, a fourth electrode area, and a channel area located between the third area and the fourth area, the second group of transistors comprising:
- a first transistor, wherein the second gate of the first transistor is electrically connected to a second clock signal line configured to provide a second clock signal, and the third electrode area of the first transistor serves as the input terminal;
- a second transistor, wherein the second gate of the second transistor is electrically connected to the fourth electrode area of the first transistor, and the third electrode area of the second transistor is electrically connected to the second gate of the first transistor;
- a third transistor, wherein the second gate of the third transistor is electrically connected to the second gate of the first transistor, the third electrode area of the third transistor is electrically connected to a second power signal line configured to receive a second power voltage, and the fourth electrode area of the third transistor is electrically connected to the fourth electrode area of the second transistor,
- a sixth transistor, wherein the second gate of the sixth transistor is electrically connected to the fourth electrode area of the second transistor, the fourth electrode area of the third transistor and the first gate of the fourth transistor, and the third electrode area of the sixth transistor is electrically connected to the first electrode area of the fourth transistor;
- a seventh transistor, wherein the second gate of the seventh transistor is electrically connected to the first electrode area of the fifth transistor, the third electrode area of the seventh transistor is electrically connected to the fourth electrode area of the sixth transistor, and the fourth electrode area of the seventh transistor is electrically connected to the second gate of the second transistor, and
- an eighth transistor, wherein the second gate of the eighth transistor is electrically connected to the second power signal line, the third electrode area of the eighth transistor is electrically connected to the second gate of the second transistor, and the fourth electrode area of the eighth transistor is electrically connected to the first gate of the fifth transistor.

19. A display device, comprising the display panel according to claim 1.

20. A display panel, comprising:
- a base substrate comprising a display area and a peripheral area surrounding the display area;
- a plurality of sub-pixels located at the display area, wherein each of the plurality of sub-pixels comprises an anode located on one side of the base substrate and a light-emitting function layer located on one side of the anode away from the base substrate;
- a driving circuit located at the peripheral area, and configured to output a gate driving signal and a light-emitting control scanning signal to the plurality of sub-pixels;
- a power line located on one side of the driving circuit away from the display area;

a connection layer electrically connected to the power line and located on one side of the driving circuit and the power line away from the base substrate, wherein an orthographic projection of the connection layer on the base substrate partially overlaps with an orthographic projection of the driving circuit on the base substrate, and a minimum distance between an edge of the orthographic projection of the connection layer on the base substrate close to the display area and an edge of an orthographic projection of the anode, which is closest to an edge of the display area of a plurality of anodes of the plurality of sub-pixels, the base substrate ranges from 150 microns to 250 microns; and a cathode electrically connected to the connection layer located at the display area and the peripheral area, and located on one side of the light-emitting function laver and the connection layer away from the base substrate, wherein:

the driving circuit comprises: a gate driving circuit located between the display area and the power line, and configured to output the gate drive signal to the plurality of sub-pixels; and a light-emitting control driving circuit located between the power line and the gate driving circuit, and configured to output the light-emitting control scanning signal to the plurality of sub-pixels, wherein the edge of the orthographic projection of the connection layer on the base substrate close to the display area is at least partially located within an orthographic projection of the gate driving circuit on the base substrate;

the display panel further comprises a first planarization layer located at the display area and the peripheral area, and comprising a first planarization portion located between the driving circuit and the connection layer, wherein the connection laver comprises a plurality of first openings spaced apart from each other, wherein orthographic projections of the plurality of first openings on the base substrate at last partially overlap with an orthographic projection of the first planarization portion on the base substrate;

the first planarization layer comprises a second opening located at the peripheral area and extending along a periphery of the display area, and the display panel further comprises:

a first conductive portion located in the second opening, located between the power line and the connection layer, and in contact with the power line and the connection layer, and a pixel defining layer located on one side of the connection layer away from the base substrate, and comprising a first pixel defining portion located at the peripheral area, wherein the first pixel defining portion comprises a plurality of filling portions spaced apart from each other, and located in the plurality of first openings in a one-to-one correspondence, and the cathode is in contact with a portion of the connection laver not covered by the pixel defining layer; and the gate driving circuit comprises a first clock signal line and a second clock signal line located on one side of the first clock signal line away from the display area, the first planarization portion comprises a third opening located above the first clock signal line and a fourth opening located above the second clock signal line, and the display panel further comprises:

a second conductive portion located in the third opening and in contact with the first clock signal line, a third conductive portion located in the fourth opening and in contact with the second clock signal line, and a second planarization layer located on one side of the first planarization layer away from the base substrate, and comprising:

a second planarization portion located between the first planarization portion and the connection laver, and covering the second conductive portion and the third conductive portion, and a third planarization portion spaced apart from the second planarization portion, located on one side of the light-emitting control driving circuit away from the display area, and comprising a fifth opening located above the first conductive portion, wherein the connection layer is partially located in the fifth opening, and a portion of the connection laver located between the third planarization portion and the second planarization portion is at least partially in contact with the first planarization layer.

* * * * *

UNITED STATES PATENT AND TRADEMARK OFFICE
CERTIFICATE OF CORRECTION

PATENT NO. : 11,871,626 B2
APPLICATION NO. : 17/283580
DATED : January 9, 2024
INVENTOR(S) : Jie Dai et al.

Page 1 of 1

It is certified that error appears in the above-identified patent and that said Letters Patent is hereby corrected as shown below:

In the Claims

Column 20, Line 23, Claim 1, delete "leas" and insert -- least --

Column 20, Line 26, Claim 1, after "plurality of" delete "a"

Column 22, Line 13, Claim 11, delete "claim/1," and insert -- claim 8, --

Column 24, Line 29, Claim 18, delete "transistor," and insert -- transistor; --

Column 25, Line 11, Claim 20, after "sub-pixels," insert -- on --

Column 25, Line 13, Claim 20, delete "layer" and insert -- layer, --

Column 25, Line 15, Claim 20, delete "layer" and insert -- layer, --

Column 25, Line 34, Claim 20, delete "layer" and insert -- layer, --

Column 25, Line 37, Claim 20, delete "last" and insert -- least --

Column 26, Line 13, Claim 20, delete "layer" and insert -- layer, --

Column 26, Line 30, Claim 20, delete "layer" and insert -- layer, --

Column 26, Line 39, Claim 20, delete "layer" and insert -- layer, --

Signed and Sealed this
Twenty-seventh Day of February, 2024

Katherine Kelly Vidal
*Director of the United States Patent and Trademark Office*